(12) United States Patent
Kang et al.

(10) Patent No.: US 6,240,030 B1
(45) Date of Patent: May 29, 2001

(54) INTEGRATED CIRCUIT DEVICES HAVING MODE SELECTION CIRCUITS THAT GENERATE A MODE SIGNAL BASED ON THE MAGNITUDE OF A MODE CONTROL SIGNAL WHEN A POWER SUPPLY SIGNAL TRANSITIONS FROM A FIRST STATE TO A SECOND STATE

(75) Inventors: Sang-suk Kang, Kyungki-do; Jung-Hyun Nam, Seoul, both of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/496,317

(22) Filed: Feb. 1, 2000

Related U.S. Application Data (63) Continuation-in-part of application No. 09/223,133, filed on Dec. 30, 1998, now Pat. No. 6,081,460.

(30) Foreign Application Priority Data

Feb. 4, 1999 (KR) .................................................... 95-3783

(51) Int. Cl.$^7$ ........................................................ G11C 7/00
(52) U.S. Cl. ...................................... 365/201; 365/189.11
(58) Field of Search ............................. 365/201, 189.11, 365/205

(56) References Cited

U.S. PATENT DOCUMENTS

| | | | |
|---|---|---|---|
| 5,615,159 | * 3/1997 | Roohparvar | 365/201 |
| 5,646,902 | 7/1997 | Park | 365/227 |
| 5,708,604 | 1/1998 | Fontana et al. | 365/185.23 |
| 5,841,691 | * 11/1998 | Fink | 365/201 |

FOREIGN PATENT DOCUMENTS 1999-0057715   7/1999   (KR) .

* cited by examiner

*Primary Examiner*—Vu A. Le
(74) *Attorney, Agent, or Firm*—Myers Bigel Sibley & Sajovec (57) ABSTRACT

Integrated circuit devices having improved test capabilities may include a mode selection circuit that generates a mode signal that designates an operational mode based on the magnitude of a mode control signal when a power supply signal transitions from a first state to a second state. A preferred embodiment of the mode selection circuit generates a mode signal that designates a first mode of the integrated circuit device when the power supply signal transitions from a first state to a second state while a magnitude of the mode control signal exceeds a potential threshold. Moreover, the mode selection circuit may also prevent subsequent changes in the magnitude of the mode control signal from disabling the first mode. The mode signal may be generated without the need for additional dummy pads and/or input pins, which may necessitate an increase in chip size and/or more complex test equipment to test an integrated circuit device.

12 Claims, 5 Drawing Sheets

INTEGRATED CIRCUIT DEVICES HAVING MODE SELECTION CIRCUITS THAT GENERATE A MODE SIGNAL BASED ON THE MAGNITUDE OF A MODE CONTROL SIGNAL WHEN A POWER SUPPLY SIGNAL TRANSITIONS FROM A FIRST STATE TO A SECOND STATE

RELATED APPLICATION

This application is a continuation-in-part of commonly assigned U. S. application Ser. No. 09/223,133, filed Dec. 30, 1998, U.S. Pat. No. 6,081,460, the disclosure of which is hereby incorporated herein by reference. Furthermore, this application claims the benefit of Korean Patent Application No. 99-3783, filed Feb. 4, 1999, the disclosure of which is hereby incorporated herein by reference.

FIELD OF THE INVENTION

The present invention relates generally to the field of integrated circuit devices and, more particularly, to testing of integrated circuit devices.

BACKGROUND OF THE INVENTION

In general, burn-in stress testing or other predetermined testing operations may be performed on integrated circuit devices while they are still in the wafer state before final packaging. Unlike operations associated with a "normal" operating mode, test mode operations, such as burn-in stress testing or other predetermined testing operations, may be carried out using only a subset of all the input and output pins associated with an integrated circuit device.

Conventional integrated circuit devices may be designed to have an additional "dummy" pad through which a mode signal may be transmitted to place the integrated circuit device into a test mode (ie., configure the integrated circuit device for burn-in stress testing or other predetermined testing operations) or into a normal operating mode. The dummy pad may further include an input pin associated therewith for transmitting the mode signal. Unfortunately, because both the dummy pad and the input pin are typically assembled inside the chip, the chip size may increase. Furthermore, more complex test equipment may be needed to generate the mode signal, which may increase the manufacturing costs of such test equipment due to the additional complexity.

Consequently, there exists a need for improved integrated circuit devices having improved test capabilities.

SUMMARY OF THE INVENTION

Integrated circuit devices having improved test capabilities may include a mode selection circuit that generates a mode signal that designates an operational mode based on the magnitude of a mode control signal when a power supply signal transitions from a first state to a second state. The mode signal may be generated without the need for additional dummy pads and/or input pins, which may necessitate an increase in chip size and/or more complex test equipment to test an integrated circuit device.

More specifically, an embodiment of the present invention includes a preferred mode selection circuit that generates a mode signal that designates a first mode of the integrated circuit device when the power supply signal transitions from a first state to a second state while a magnitude of the mode control signal exceeds a potential threshold. Moreover, the mode selection circuit may also prevent subsequent changes in the magnitude of the mode control signal from disabling the first mode.

In accordance with an aspect of the present invention, the mode selection circuit may include a control circuit and an operation mode signal generator. The control circuit may include a level shifting circuit, a sequence detector circuit, and output logic connected in series. The level shifting circuit may generate an output signal by shifting the magnitude of the mode control signal downward. The sequence detector circuit is responsive to the output signal from the level shifting circuit and may generate an output signal in which the logic level is based on the relative sequencing of the voltage levels between the mode control signal and the power supply signal. The output logic is responsive to both the output signal from the sequence detector and the mode signal, and, preferably, generates a control circuit output signal by performing a logical NOR of these two signals.

In accordance with another aspect of the present invention, the operation mode signal generator may comprise a differential amplifier and a mode signal output circuit. The differential amplifier preferably has a first input terminal that is responsive to the mode control signal and a second input terminal that is responsive to the power supply signal. The mode signal output circuit may have an input terminal connected to an output terminal of the differential amplifier and generates the test-mode signal at an output terminal thereof in response to output signals from the differential amplifier and the control circuit.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. It will be further understood that each embodiment described and illustrated herein includes its complementary conductivity type embodiment as well. Like reference numbers signify like elements throughout the description of the figures.

Figure 1:
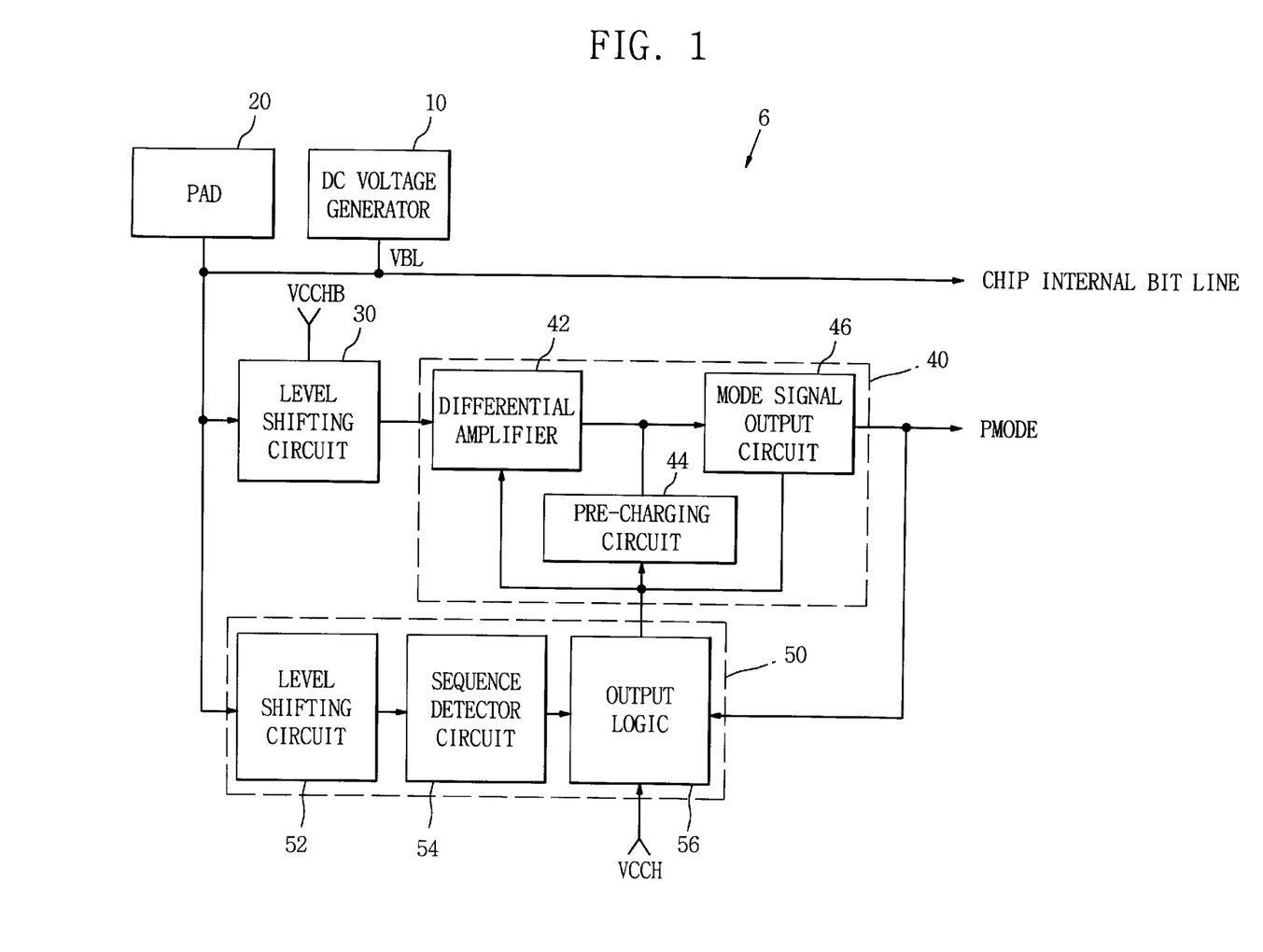
FIG. 1 is a block diagram of an embodiment of mode selection circuits in accordance with the present invention, which generate a mode signal in response to the sequencing a mode control signal and a power supply signal.

Referring now to FIG. 1, a preferred mode selection circuit 6, in accordance with the present invention, includes a direct current (DC) voltage generator 10 that generates a DC voltage VBL when a power supply signal VCC is applied. The DC voltage generator 10 preferably generates the voltage VBL at a magnitude that is approximately half the magnitude of the power supply signal VCC at steady state. The voltage VBL is provided to internal chip components via a chip internal bit line.

The mode selection circuit 6 further includes a pad 20, through which a mode control signal may be input to the mode selection circuit 6. In particular, the pad 20 receives a mode control signal that, along with the power supply signal VCC, is used by the mode selection circuit 6 to generate a mode signal PMODE. Thus, the voltage VBL may also be manipulated through the mode control signal, which is input through the pad 20. In a preferred embodiment illustrated in FIG. 1, the mode signal PMODE is driven to a "high" voltage level during a testing mode for an integrated circuit device and is driven to a "low" voltage level during a normal operating mode for an integrated circuit device. To place the integrated circuit device into a test mode, the pad 20 receives a mode control signal having a magnitude that exceeds the magnitude of the power supply signal VCC in steady state as will be described in more detail hereinafter.

A level shifting circuit 30 is connected to the output terminal of the pad 20 and the chip internal bit line. The level shifting circuit 30 is responsive to the mode control signal input through the pad 20.

An output signal from the level shifting circuit 30 is provided as an input signal to an operation mode signal generator 40, which comprises a differential amplifier 42, a pre-charging circuit 44, and a mode signal output circuit 46 configured as shown. The mode signal output circuit 46 is responsive to an output signal from the differential amplifier 42 and generates the mode signal PMODE at an output terminal thereof. The pre-charging circuit 44 may be used to control the voltage level at the input of the mode signal output circuit 46.

The operation mode signal generator 40 is responsive to an output signal from a control circuit 50, which comprises a level shifting circuit 52, a sequence detector circuit 54, and output logic 56 connected in series as shown. The level shifting circuit 52 is connected to the output terminal of the pad 20 and the chip internal bit line and generates an output signal by stepping down the voltage VBL. This stepped down voltage is provided as an input to the sequence detector circuit 54, which is configured to generate an output signal based on the sequence in which the mode control signal and the power supply signal VCC are applied. Finally, the output logic 56 is responsive to the output signal from the sequence detector circuit 54 and the mode signal PMODE. The output logic 56 generates the output signal from the control circuit 50, which is used to control the operation mode signal generator 40.

Figure 2:
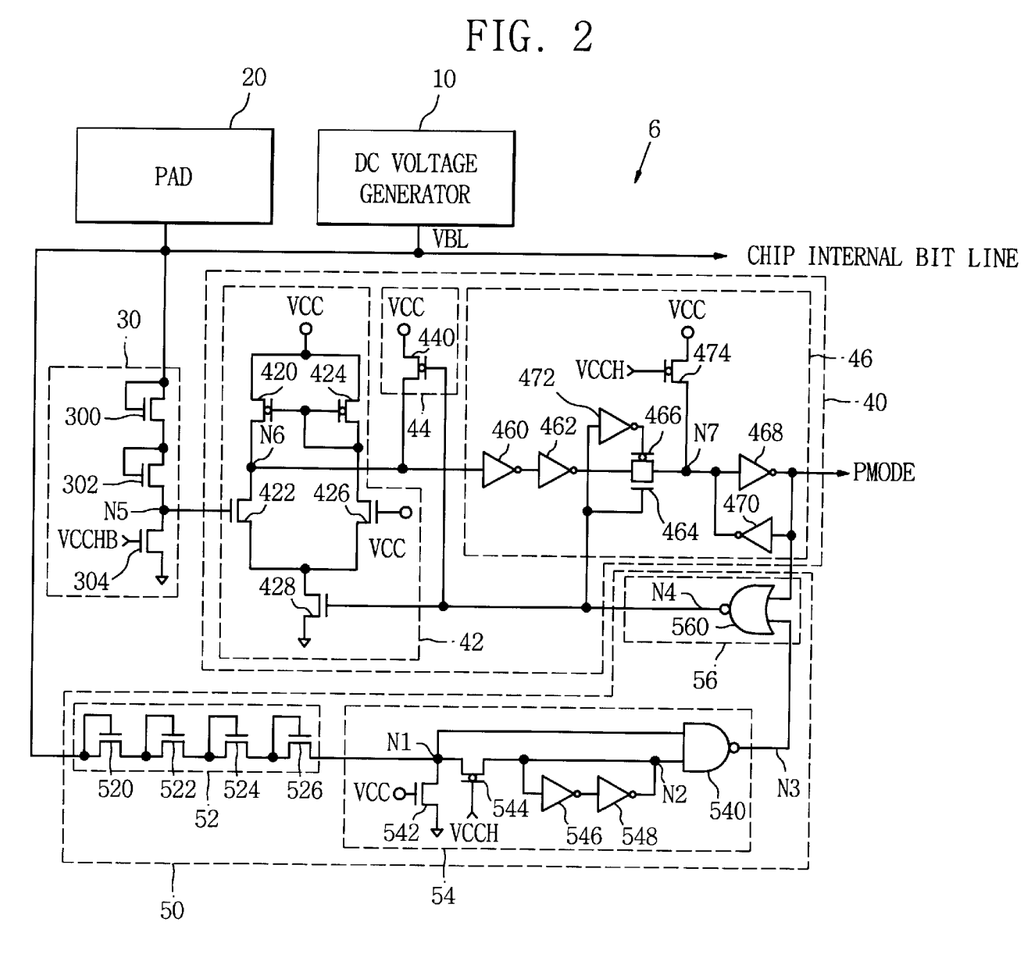
FIG. 2 is a circuit schematic that illustrates the mode selection circuits of FIG. 1 in greater detail.

With reference to FIG. 2, exemplary circuit schematics for the level shifting circuit 30, the operation mode signal generator 40, and the control circuit 50 will now be described. The level shifting circuit 30 preferably comprises a plurality of NMOS transistors 300, 302, and 304 connected in series between the output terminal of the pad 20 or chip internal bit line and a common reference potential (e.g., ground). NMOS transistors 300 and 302 are preferably configured as diodes between the output terminal of the pad 20 and an intermediate output node N5. NMOS transistor 304 is connected in series between the intermediate output node N5 and the common reference potential and has a gate terminal coupled to a power supply voltage inversion signal VCCHB. Accordingly, the NMOS transistors 300 and 302 may be used to generate a voltage at the intermediate output node N5 by stepping down the magnitude of the voltage VBL on the chip internal bit line by a magnitude of $2V_{th}$, where $V_{th}$ corresponds to the threshold voltage of the NMOS transistors 300 and 302.

The differential amplifier 42 comprises PMOS transistors 420 and 424 and NMOS transistors 422, 426, and 428 configured as a differential amplifier. The gate terminals of the NMOS transistors 422 and 426 serve as input terminals for the differential amplifier and are connected to the intermediate output node N5 of the level shifting circuit 30 and the power supply signal VCC, respectively. Finally, the differential amplifier 42 generates an output signal at node N6 where the drain terminals of the PMOS transistor 420 and the NMOS transistor 422 are connected.

The gate terminal of the NMOS transistor 428 is connected to the output signal from the control circuit 50 at node N4. Thus, if the control circuit 50 generates an output signal at a "high" voltage level, the NMOS transistor 428 may turn on thereby allowing the differential amplifier 42 to operate. If, however, the control circuit 50 generates an output signal at a "low" voltage level, then the NMOS transistor 428 may turn off, which may deactivate the differential amplifier 42.

The pre-charging circuit 44 preferably comprises a pre-charging circuit that includes a PMOS transistor 440 connected in series between the power supply signal VCC and the output terminal of the differential amplifier 42 at node N6. The gate terminal of the PMOS transistor 440 is connected to the output signal from the control circuit 50 at node N4. As discussed in the foregoing, when the control circuit 50 generates an output signal at a "low" voltage level, the differential amplifier 42 may be deactivated. The PMOS transistor 440 may be turned on, however, by the "low" voltage level at node N4, which pulls the output terminal N6 of the differential amplifier 42 up to the voltage level of the power supply signal VCC.

The mode signal output circuit 46 preferably comprises a pair of inverters 460 and 462 connected in series between the output terminal of the differential amplifier 42 at node N6 and a transmission gate circuit. The transmission gate circuit comprises an NMOS transistor 464, a PMOS transistor 466, and an inverter 472 configured as shown. The input terminal to the inverter 472 and the gate terminal of the NMOS transistor 464 are both coupled to the output signal from the control circuit 50 at node N4. The mode signal output circuit 46 further comprises a latch circuit that includes inverters 468 and 470, which are connected between the output of the transmission gate circuit and the output terminal of the mode signal output circuit 46. Note that the mode signal PMODE is provided at the output terminal of the mode signal output circuit 46, which corresponds to the output terminal of the operation mode signal generator 40. Finally, the mode signal output circuit 46 preferably includes a PMOS transistor 474 connected in series between the power supply signal VCC and the node N7 where the output of the transmission gate circuit is connected to the input of the latch circuit (i.e., the input terminal of the inverter 468 and the output terminal of the inverter 470). The gate terminal of the PMOS transistor 474 is connected to a power supply voltage non-inversion signal VCCH.

As will be described in greater detail hereinafter, the power supply voltage non-inversion signal VCCH tracks the power supply signal VCC once the power supply signal VCC has exceeded a predetermined magnitude. Otherwise, the power supply voltage non-inversion signal VCCH remains at a "low" voltage level. Accordingly, the PMOS transistor 474 may be turned on as the power supply signal VCC transitions from a "low" voltage level to a "high" voltage level. The voltage level at node N7 may, therefore, be pulled up to the magnitude of the power supply signal VCC, which results in the latch circuit (i. e., inverters 468 and 470) generating the mode signal PMODE at a "low" voltage level. When the control circuit 50 generates an output signal at a "high" voltage level, however, the NMOS transistor 464 and the PMOS transistor 466 comprising the transmission gate circuit are turned on thereby allowing the output signal from the differential amplifier 42 to pass through to the latch circuit (i. e., inverters 468 and 470) to be output as the mode signal PMODE. Conversely, when the control circuit 50 generates an output signal at a "low" voltage level, the NMOS transistor 464 and the PMOS transistor 466 comprising the transmission gate circuit are turned off. The latch circuit (i.e., inverters 468 and 470) is, therefore, electrically isolated from the differential amplifier 42, which causes the current voltage level for the mode signal PMODE to be continuously output.

As discussed hereinabove, the control circuit 50 preferably comprises a level shifting circuit 52, a sequence detector circuit 54 and output logic 56 configured in series as shown. The level shifting circuit 52 may comprise a plurality of NMOS transistors 520, 522, 524, and 526 connected in series as shown. Accordingly, the NMOS transistors 520, 522, 524, and 526 may be used to generate a voltage at an output terminal of the level shifting circuit 52 by stepping down the magnitude of the voltage VBL on the chip internal bit line by $4V_{th}$, where $V_{th}$ corresponds to the threshold voltage of the NMOS transistors 520, 522, 524, and 526.

The sequence detector circuit 54 preferably comprises a NAND logic gate 540 that has a first input terminal connected to the output terminal from the level shifting circuit 52 at node N1. An NMOS transistor 542 is connected in series between the first input terminal of the NAND logic gate 540 and a common reference potential. The gate terminal of the NMOS transistor 542 is connected to the power supply signal VCC. The sequence detector circuit 54 further comprises a PMOS transistor 544 connected between the node N1 and a second input terminal of the NAND logic gate 540. A latch circuit, which comprises pair of inverters 546 and 548 connected in series, is connected in parallel to the second input terminal of the NAND logic gate 540. The gate terminal of the PMOS transistor 544 is connected to the power supply voltage non-inversion signal VCCH.

When the power supply signal VCC is at a "low" voltage level, the power supply voltage non-inversion signal VCCH is also at a "low" voltage level. As a result, the NMOS transistor 542 is turned off and the PMOS transistor 544 is turned on thereby providing the output signal from the level shifting circuit 52 to both input terminals of the NAND logic gate 540 and the latch circuit (i.e., inverters 546 and 548). When the power supply signal VCC transitions from a "low" voltage level to a "high" voltage level, however, the NMOS transistor 542 turns on to pull the voltage level at the node N1 down to the common reference potential. As a result, the NAND logic gate 540 outputs a logic 1 value (i.e., a "high" voltage level).

The output logic 56 preferably comprises a NOR logic gate 560 having a first input terminal connected to the output terminal of the sequence detector circuit 54 at node N3 and a second input terminal that is connected to the output of the operation mode signal generator 40, which provides the mode signal PMODE. The NOR logic gate 560 generates a control circuit 50 output signal at node N4 based on the mode signal PMODE and the output signal from the sequence detector circuit 54.

When the sequence detector circuit 54 generates an output signal at a "low" voltage level and the mode signal PMODE is at a "low" voltage level, the NOR logic gate 560 will drive the control circuit 50 output signal to a "high" voltage level at node N4. This may allow the operation mode signal generator 40 to generate the mode signal PMODE based on the output signal from the level shifting circuit 30. Otherwise, when either the output signal from the sequence detector circuit 54 or the mode signal PMODE is at a "high" voltage level, the NOR logic gate 560 will drive the control circuit 50 output signal to a "low" voltage level at node N4. As a result, the mode signal PMODE stored in the latch circuit (i.e., inverters 468 and 470) in the mode signal output circuit 46 will be continuously output.

Figure 3:
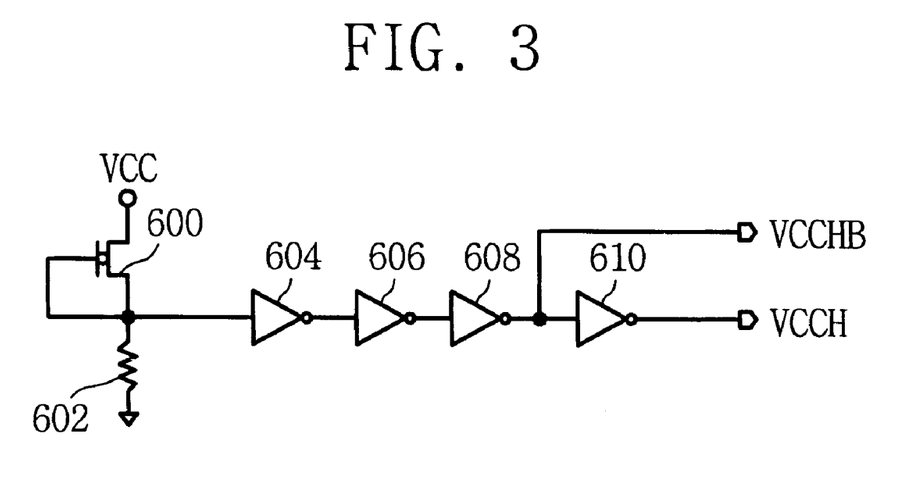
FIG. 3 is a circuit schematic that illustrates the derivation of two control signals based on the power supply signal.

FIG. 3 is a circuit schematic that illustrates the derivation of the power supply voltage non-inversion signal VCCH and the power supply voltage inversion signal VCCHB based on the power supply signal VCC. As shown in FIG. 3, a PMOS transistor 600 and a resistor 602 are connected in series between the power supply signal VCC and a common reference potential. The PMOS transistor 600 is configured as a diode with its gate terminal connected to its drain terminal and the resistor 602. The signal provided at the gate and drain terminals of the PMOS transistor 600 is provided to a plurality of inverters 604, 606, 608, and 610, which are connected in series as shown in FIG. 3. The inverter 608 generates the power supply voltage inversion signal VCCHB at its output terminal while the inverter 610 generates the power supply voltage non-inversion signal VCCH at its output terminal.

Exemplary operations of mode selection circuits of FIGS. 2 and 3 will be described hereafter with reference to FIGS. 4 and 5. Broadly stated, the control circuit 50 is responsive to the sequence in which the mode control signal and the power supply signal VCC are applied to the mode selection circuit 6. Accordingly, a mode signal PMODE may be generated at a first logic level if the magnitude of the mode control signal exceeds a predetermined voltage or potential threshold at a time in which the power supply signal VCC transitions from a "low" voltage level to a "high" voltage level (i.e., from a logic 0 state to a logic 1 state). Conversely, the mode signal PMODE may be generated at a second logic level if the power supply signal VCC transitions from a "low" voltage level to a "high" voltage level at a time in which the magnitude of the mode control signal does not exceed the predetermined voltage or potential threshold. For example, the mode signal PMODE may driven to a "high" voltage level (i.e., a logic 1 state) to configure an integrated circuit device for burn-in stress testing or other predetermined testing operations and may be driven to a "low" voltage level (i.e., a logic 0 state) to configure an integrated circuit device for normal operation. This convention is adopted for purposes of illustration and may be reversed without departing from the principles of the present invention.

To drive the mode signal PMODE to a "high" voltage level, the pad 20 receives a mode control signal having a magnitude that is greater than a magnitude of the power supply signal VCC when the power supply signal VCC is subsequently applied. The steady state magnitude of the power supply signal VCC after the power supply signal VCC has been applied to the mode selection circuit 6 will be referred to herein as the "VCC application magnitude." Preferably, the mode control signal received through the pad 20 drives the voltage VBL on the chip internal bit line to a magnitude corresponding to the VCC application magnitude $+4V_{th}$ as shown in FIG. 4 at time t1. Recall that $V_{th}$ corresponds to the threshold voltages of the NMOS transistors 300, 302, 520, 522, 524, and 526. Note also that during the time interval from t1 to t2, the power supply signal VCC has yet to be applied and, therefore, remains at a "low" voltage level (i.e., a logic 0 state) as shown in FIG. 4.

The voltage VBL is received by the level shifting circuit 52 where the voltage level drops by 4V$_{th}$ across the NMOS transistors 520, 522, 524, and 526. As a result, the output signal from the level shifting circuit 52 has a magnitude corresponding to the VCC application magnitude as shown in FIG. 4. In addition, the first input terminal of the NAND logic gate 540 in the sequence detector circuit 54 is driven to a "high" voltage level (i.e., a logic 1 state).

The voltage VBL is also received by the level shifting circuit 30 where the voltage level drops by 2V$_{th}$ across the NMOS transistors 300 and 302. Accordingly, a voltage level corresponding to the VCC application magnitude +2V$_{th}$ is output at the intermediate output node N5 as shown in FIG. 4. The output signal from the level shifting circuit 30 is provided as an input signal to the differential amplifier 42. In particular, a voltage having a magnitude corresponding to the VCC application magnitude +2V$_{th}$ is applied to the gate terminal of the NMOS transistor 422.

Between times t1 and t2, the power supply signal VCC remains at a "low" voltage level (i.e., a logic 0 state). Beginning at time t2, however, the power supply signal VCC starts a transition from the "low" voltage level to a "high" voltage level (i.e., a transition from a logic 0 state to a logic 1 state) as shown in FIG. 4. Accordingly, the power supply voltage inversion signal VCCHB tracks the power supply signal VCC until the power supply signal VCC reaches the minimum voltage level associated with a logic 1 at time t3. At this time, the power supply voltage inversion signal VCCHB returns to the "low" voltage level as shown in FIG. 4. Conversely, the power supply voltage non-inversion signal VCCH transitions from a "low" voltage level to a "high" voltage level at time t3 as shown in FIG. 4.

Up until time t3, the power supply voltage non-inversion signal VCCH exhibited a "low" voltage level. Accordingly, between times t2 and t3, the PMOS transistor 544 in the sequence detector circuit 54 is turned on, which allows the output signal from the level shifting circuit 52 to propagate to both input terminals of the NAND logic gate 540. In particular, both input terminals of the NAND logic gate 540 are driven to a "high" voltage level corresponding to the VCC application magnitude as shown in FIG. 4. Note that the latch circuit in the sequence detector circuit 54, which comprises inverters 546 and 548, stores the voltage level applied to the node N2 as shown in FIG. 4.

Referring now to the mode signal output circuit 46, the PMOS transistor 474 is turned on by the "low" voltage level of the power supply voltage non-inversion signal VCCH during the interval between times t2 and t3, which allows the power supply signal VCC to pass through to the input node N7 of the latch circuit (i.e., inverters 468 and 470). Accordingly, the input node N7 of the latch circuit transitions from a "low" voltage level to a "high" voltage level between the times t2 and t3 and is "latched" at the "high" voltage level by the inverters 468 and 470 after the time t3 when the PMOS transistor 474 is turned off as shown in FIG. 4.

Figure 4:
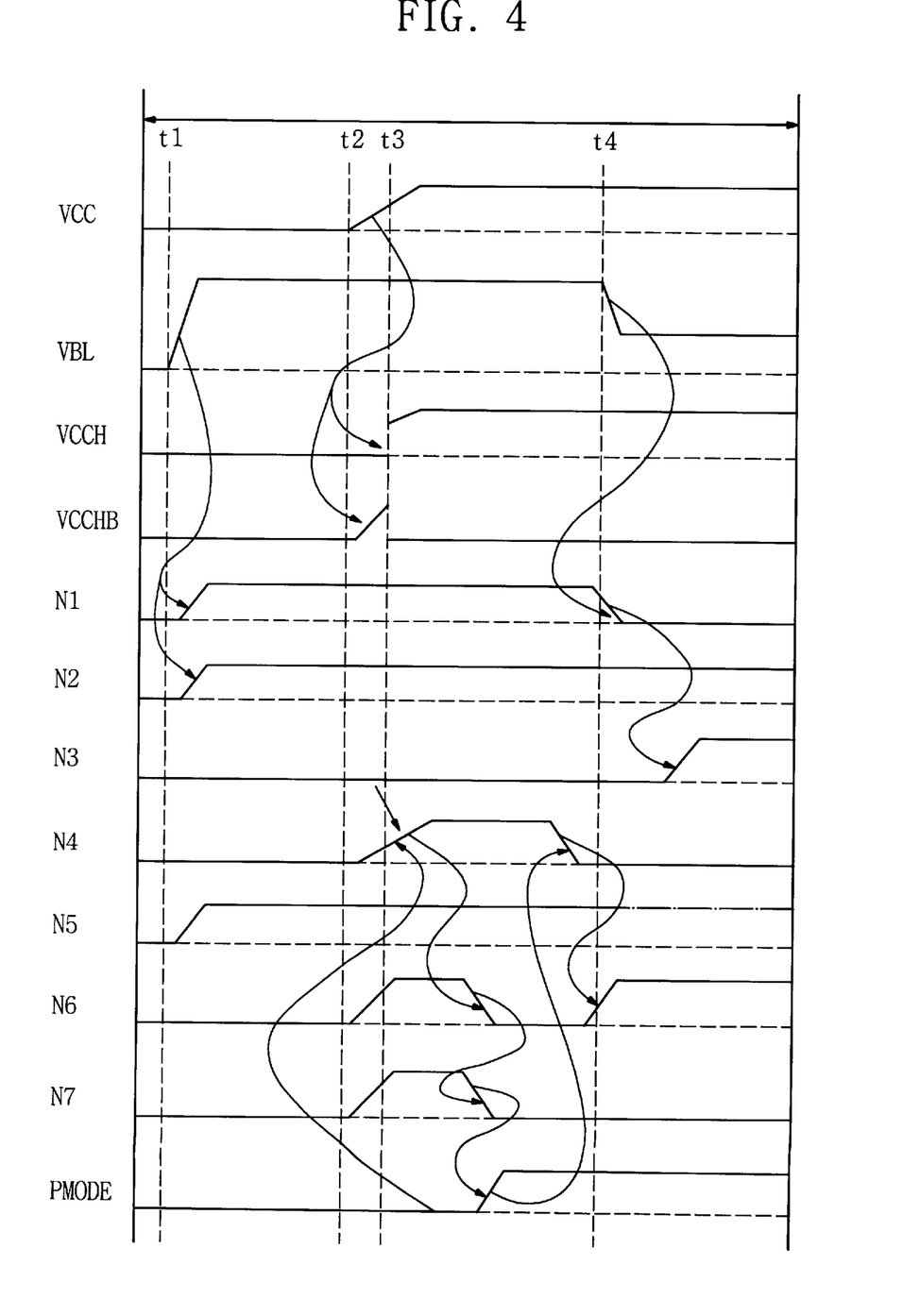
FIGS. 4 and 5 are waveform diagrams that illustrate exemplary operations of the mode selection circuits of FIGS. 1–2.

Because both input terminals of the NAND logic gate 540 are driven to a "high" voltage level (i.e., a logic 1 state), the output signal from the NAND logic gate 540 is driven to a "low" voltage level (i.e., a logic 0 state) as shown in FIG. 4. Thus, the output logic 56, which comprises the NOR logic gate 560, receives a "low" voltage level on one input terminal from the output of the sequence detector circuit 54 and a "low" voltage level on the other input terminal from the output of the operation mode signal generator 40, which corresponds to the mode signal PMODE (see FIG. 4). The output signal from the control circuit 50 (i.e., the output signal from the NOR logic gate 560), therefore, begins to transition from a "low" voltage level to a "high" voltage level between the times t2 and t3 as the power supply signal VCC transitions from a "low" voltage level to a "high" voltage level as shown in FIG. 4. The "high" voltage level output from the control circuit 50 turns on the NMOS transistor 428 in the differential amplifier 42, which enables operation of the differential amplifier contained therein. In addition, the PMOS transistor 440, which comprises the pre-charging circuit 44, is turned off and the transmission gate, which is comprised of NMOS transistor 464 and PMOS transistor 466, is turned on to allow the output signal from the differential amplifier 42 to propagate through to the latch circuit (i.e., inverters 468 and 470) in the mode signal output circuit 46.

As discussed hereinabove, at time t3, the power supply signal VCC reaches a voltage level that corresponds to a logic 1, which causes the power supply voltage inversion signal VCCHB to transition to a "low" voltage level and the power supply voltage non-inversion signal VCCH to track the power supply signal VCC until reaching a "high" voltage level shortly after the time t3 as shown in FIG. 4.

Between times t2 and t3, the voltage level at node N6, which is the output terminal of the differential amplifier 42, is pulled to a "high" voltage level by the pre-charging circuit 44. Thus, the voltage level at node N6 is at a "high" voltage level soon after time t3 as shown in FIG. 4. Recall, however, that the voltage level at the gate terminal of the NMOS transistor 422 has a magnitude that corresponds to the VCC application magnitude +2V$_{th}$, which exceeds the voltage level at the gate terminal of the NMOS transistor 426 (i.e., the other input terminal to the differential amplifier 42) by 2V$_{th}$. Accordingly, the voltage level at node N6 is pulled down to a "low" voltage level once the output signal from the control circuit 50 is driven to a "high" voltage level to activate the differential amplifier 42 as shown in FIG. 4. Thus, it can be seen that the mode control signal should be driven to a magnitude that is greater than the VCC application magnitude to ensure that the voltage level at node N6 is pulled down to a "low" voltage level once the differential amplifier 42 is activated. The magnitude used for the mode control signal should be based on the structure of the level shifting circuits 30 and 50. That is, the mode control signal should be driven to a high enough magnitude such that after the mode control signal is level shifted down by the level shifting circuits 30 and 50 the voltage level at node N5 exceeds the VCC application magnitude and the voltage level at node N1 is sufficient to correspond to a logic 1 state.

The output signal from the differential amplifier 42 at node N6 is then provided to the mode signal output circuit 46, where it is passed through the inverters 460 and 462, and the transmission gate, which is comprised of the NMOS transistor 464 and the PMOS transistor 466, until reaching the latch circuit, which is comprised of the inverters 468 and 470. The inverter 468 inverts the output signal from the differential amplifier 42 and generates the mode signal PMODE at a "high" voltage level as shown in FIG. 4.

The mode signal PMODE is fed back into the operation mode signal generator 40 through the output logic 56 (i.e., the NOR logic gate 560). Accordingly, when the mode signal PMODE is driven to a "high" voltage level, the output signal from the NOR logic gate 560 is driven to a "low" voltage level as shown in FIG. 4. As a result, the NMOS transistor 428 is turned off, which turns the differential amplifier 42 off. The PMOS transistor 440 is turned on, which causes the pre-charging circuit 44 to drive the voltage level at the output of the differential amplifier 42 to a "high" voltage level as shown in FIG. 4. Finally, the NMOS transistor 464 and the PMOS transistor 466, which comprise the transmission gate in the mode signal output circuit 46 are turned off, which electrically isolates the latch circuit (i.e., inverters 468 and 470) from the differential amplifier 42 and the pre-charging circuit 44.

At time t4, application of the mode control signal through the pad 20 is discontinued (i.e., reduced to ground level, zero volts, or a common reference potential). This allows the voltage VBL to return to a level controlled by the DC voltage generator 10, which is typically one-half the VCC application magnitude as shown in FIG. 4. Nevertheless, the mode signal PMODE remains latched at a "high" voltage level by the inverters 468 and 470 as shown in FIG. 4, which may allow test mode operations, such as burn-in stress testing or other predetermined testing operations to be performed on an integrated circuit device.

To drive the mode signal PMODE to a "low" voltage level (e.g., to configure an integrated circuit device for normal operation), the power supply signal VCC may be applied (i.e., transition from a "low" voltage to a "high" voltage or from a logic 0 state to a logic 1 state) prior to any application of a mode control signal through the pad 20 (i.e., before the mode control signal drives the voltage VBL to magnitude that exceeds the VCC application magnitude).

Figure 5:
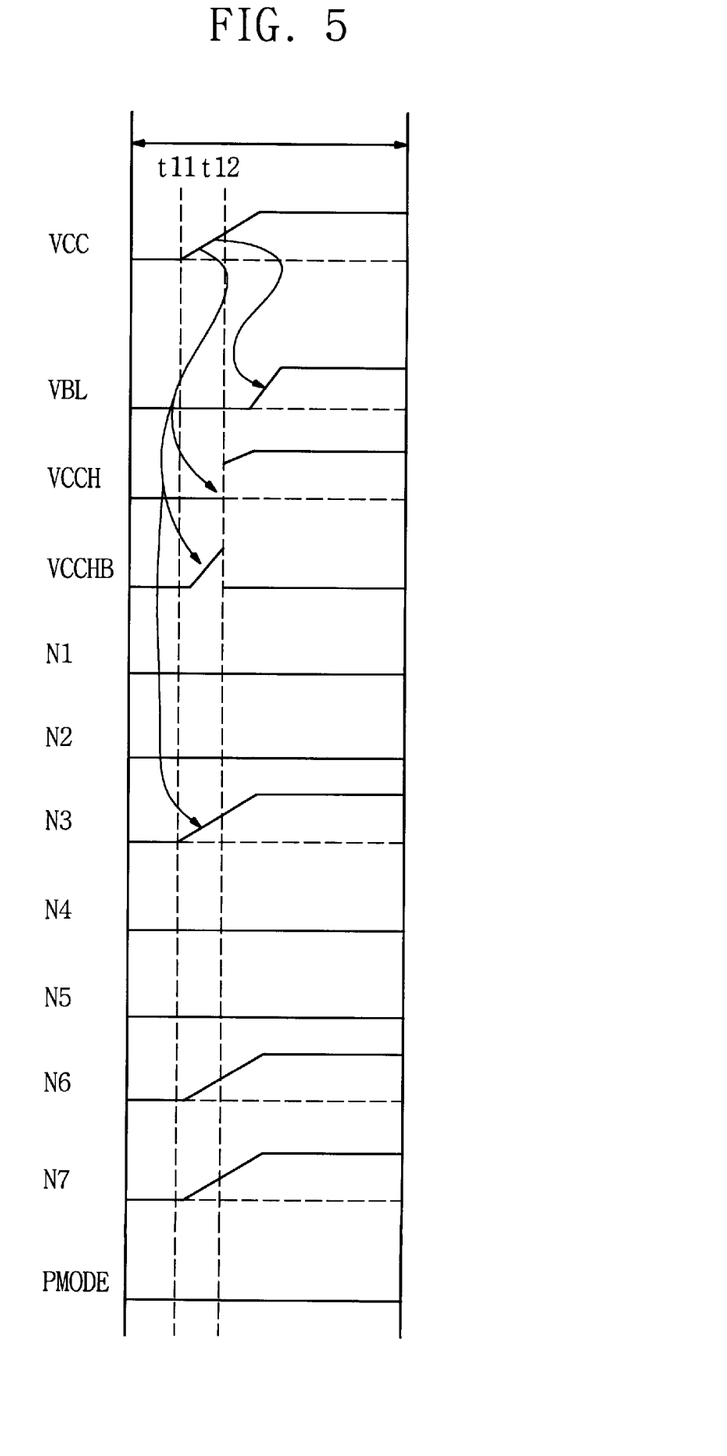

Referring now to FIG. 5, the power supply signal VCC starts a transition from the "low" voltage level to a "high" voltage level (i.e., a transition from a logic 0 state to a logic 1 state) at time til as shown in FIG. 5. Accordingly, the power supply voltage inversion signal VCCHB tracks the power supply signal VCC until the power supply signal VCC reaches the minimum voltage level associated with a logic 1 at time t12. At this time, the power supply voltage inversion signal VCCHB returns to the "low" voltage level as shown in FIG. 5. Conversely, the power supply voltage non-inversion signal VCCH transitions from a "low" voltage level to a "high" voltage level at time t12 as shown in FIG. 5.

The PMOS transistor 474 of the mode signal output circuit 46 is turned on by the "low" voltage level of the power supply voltage non-inversion signal VCCH during the interval between times t11 and t12, which allows the power supply signal VCC to pass through to the input node N7 of the latch circuit (i.e., inverters 468 and 470). Accordingly, the input node N7 of the latch circuit transitions from a "low" voltage level to a "high" voltage level between the times t11 and t12 and is "latched" at the "high" voltage level by the inverters 468 and 470 after the time t12 when the PMOS transistor 474 is turned off as shown in FIG. 5. The inverter 468 inverts the signal at the node N7, which has been pulled to a "high" voltage level by the PMOS transistor 474, to generate the mode signal PMODE at a "low" voltage level as shown in FIG. 4.

As the power supply signal VCC transitions from a "low" voltage level to a "high" voltage level (i.e., from a logic 0 state to a logic 1 state) between the times t11 and t12, the NMOS transistor 542 in the sequence detector circuit 54 is turned on, which drives the voltage level at the node N1 to a "low" voltage level. Accordingly, the output signal from the NAND logic gate 540 transitions from a "low" voltage level to a "high" voltage level between the times t11 and t12 in concert with the power supply signal VCC as shown in FIG. 5. Because the output signal from the NAND logic gate 540 tracks the power supply signal VCC, the output signal from the control circuit 50 (i.e., the output signal from the NOR logic gate 560) remains constant at a "low" voltage level as shown in FIG. 5.

As a result, the NMOS transistor 428 is turned off, which turns the differential amplifier 42 off. The PMOS transistor 440 is turned on, which causes the pre-charging circuit 44 to drive the voltage level at the output of the differential amplifier 42 to a "high" voltage level in concert with the power supply signal VCC as shown in FIG. 5. Finally, the NMOS transistor 464 and the PMOS transistor 466, which comprise the transmission gate in the mode signal output circuit 46, are turned off, which electrically isolates the latch circuit (i.e., inverters 468 and 470) from the differential amplifier 42 and the pre-charging circuit 44.

After the power supply signal VCC has completed its transition to a "high" voltage, the mode signal PMODE remains at a "low" voltage level as shown in FIG. due to the latch circuit (i.e., inverters 468 and 470) in the mode signal output circuit 46, which may allow an integrated circuit device to operate in a normal operation mode.

The principles of the present invention have been described herein in connection with a mode selection circuit for an integrated circuit device. From the foregoing it can readily be seen that the present invention may allow generation of a mode signal through selective sequencing of a mode control signal and a power supply signal. Advantageously, a mode signal may be generated without the need for additional dummy pads and/or input pins, which may necessitate an increase in chip size and/or more complex test equipment to test an integrated circuit device.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit device, comprising:
    a mode selection circuit that generates a mode signal that designates a first mode of the integrated circuit device when a power supply signal transitions from a first state to a second state while a magnitude of a mode control signal exceeds a potential threshold and that prevents subsequent changes in the magnitude of the mode control signal from disabling the first mode.

2. An integrated circuit device as recited in claim 1, wherein the mode selection circuit comprises:
    a control circuit that is responsive to the mode control signal and the power supply signal and generates an output signal; and
    an operation mode signal generator that is responsive to the control circuit output signal and that generates the mode signal.

3. An integrated circuit device as recited in claim 2, wherein the operation mode signal generator comprises:
    a differential amplifier having first and second input terminals and an output terminal; and
    a mode signal output circuit having an input terminal electrically connected to the output terminal of the differential amplifier and that generates the mode signal at an output terminal thereof.

4. An integrated circuit as recited in claim 3, wherein the operation mode signal generator further comprises a pre-charging circuit electrically connected in series between the output terminal of the differential amplifier and the power supply signal, the pre-charging circuit being responsive to the control circuit output signal.

5. An integrated circuit as recited in claim 3, wherein the first input terminal of the differential amplifier is responsive to the power supply signal, the integrated circuit device further comprising:

a level shifting circuit having an input terminal that is responsive to the mode control signal and having an intermediate output node electrically connected to the second input terminal of the differential amplifier.

6. An integrated circuit as recited in claim 5, wherein the level shifting circuit comprises:

a plurality of diodes electrically connected in series between the input terminal of the level shifting circuit and the intermediate output node of the level shifting circuit; and an NMOS transistor electrically connected in series between the intermediate output node of the level shifting circuit and a common reference potential.

7. An integrated circuit as recited in claim 3, wherein the mode signal output circuit comprises:

a transmission gate circuit;

a pair of inverters electrically connected in series between an input terminal of the transmission gate circuit and the input terminal of the mode signal output circuit;

a latch circuit having an input terminal electrically connected to an output terminal of the transmission gate circuit; and a PMOS transistor electrically connected in series between the power supply signal and the input terminal of the latch circuit.

8. An integrated circuit as recited in claim 2, wherein the control circuit comprises:

a level shifting circuit having an input terminal having an input terminal that is responsive to the mode control signal; and a sequence detector circuit having an input terminal electrically connected to an output terminal of the level shifting circuit; and output logic having a first input terminal electrically connected to an output terminal of the sequence detector and a second input terminal that is responsive to the mode signal.

9. An integrated circuit as recited in claim 8, wherein the level shifting circuit comprises:

a plurality of diodes electrically connected in series between the input and output terminals of the level shifting circuit.

10. An integrated circuit as recited in claim 8, wherein the sequence detector circuit comprises:

a NAND logic gate having a first input terminal electrically connected to the input terminal of the sequence detector circuit and an output terminal electrically connected to the output terminal of the sequence detector circuit;

an NMOS transistor electrically connected in series between the first input terminal of the sequence detector circuit and a common reference potential;

a PMOS transistor electrically connected in series between the input terminal of the sequence detector circuit and a second input terminal of the NAND logic gate; and a latch circuit electrically connected in parallel with the second input terminal of the NAND logic gate.

11. An integrated circuit as recited in claim 8, wherein the output logic comprises:

a NOR logic gate.

12. A method of operating an integrated circuit device, comprising the steps of:

determining a magnitude of a mode control signal;

detecting a transition of a power supply signal from a first state to a second state; and generating a mode signal that designates a first mode of the integrated circuit device when the power supply signal transitions from the first state to the second state while the magnitude of the mode control signal exceeds a potential threshold; and preventing, responsive to the step of generating the mode signal, subsequent changes in the magnitude of the mode control signal from disabling the first mode.

* * * * *